(12) United States Patent
Yamamoto (10) Patent No.: US 6,538,208 B2
(45) Date of Patent: Mar. 25, 2003

(54) PACKAGE BASE FOR MOUNTING ELECTRONIC ELEMENT, ELECTRONIC DEVICE AND METHOD OF PRODUCING THE SAME

(75) Inventor: Izumi Yamamoto, Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 10/087,945

(22) Filed: Mar. 5, 2002

(65) Prior Publication Data

US 2002/0125041 A1 Sep. 12, 2002

(30) Foreign Application Priority Data

Mar. 6, 2001 (JP) ......................................... 2001-061026

(51) Int. Cl.[7] ................................................ H05K 1/03
(52) U.S. Cl. ..................... 174/255; 331/68; 331/108 D; 257/719
(58) Field of Search ............................. 331/68, 108 D; 174/256, 255; 310/348, 311; 361/660, 679; 257/678, 719

(56) References Cited

U.S. PATENT DOCUMENTS 5,877,101 A * 3/1999 Terai ............................ 501/32
5,925,973 A * 7/1999 Eda et al. .................... 310/348
5,945,774 A * 8/1999 Shih et al. ................... 310/348
6,133,674 A * 10/2000 Fry ............................. 310/343
6,249,049 B1 * 6/2001 Kamada et al. ............. 257/703

FOREIGN PATENT DOCUMENTS

JP            7038334       2/1995
JP         2000232332       8/2000

* cited by examiner

Primary Examiner—Albert W. Paladini
(74) Attorney, Agent, or Firm—Finnegan, Henderson, Farabow, Garrett & Dunner, L.L.P.

(57) ABSTRACT

A package base for mounting an electronic element, an electronic device using the package base, particularly a crystal resonator. The package base comprises an insulative substrate, and an internal electrode formed at a predetermined position on the substrate, the internal electrode being bonded to the electronic element. A junction member comprising a junction layer composed of a conductive junction alloy having a melting point higher than the mounting temperature and an anti-oxidation conductive layer covering the junction layer is further provided on the internal electrode.

20 Claims, 5 Drawing Sheets

PACKAGE BASE FOR MOUNTING ELECTRONIC ELEMENT, ELECTRONIC DEVICE AND METHOD OF PRODUCING THE SAME

BACKGROUND OF THE INVENTION

1. Field of the Invention

The present invention relates to an electronic device, more particularly, to an electronic device comprising a housing of an insulating material having mounted therein an electronic element such as a semiconductor element and a quartz element, and a method of producing the same. The present invention also relates to a package base for mounting an electronic element, i.e. a component part of the electronic device.

2. Description of Related Art

As is well known, various electronic devices currently have been proposed and practically used. Some examples include an IC package having an IC chip mounted thereon and a crystal resonator having a quartz element mounted thereon. These electronic devices have been generally produced by mounting an electronic element in a housing constituted of a package base and a cap, and sealing the housing.

Figure 1:
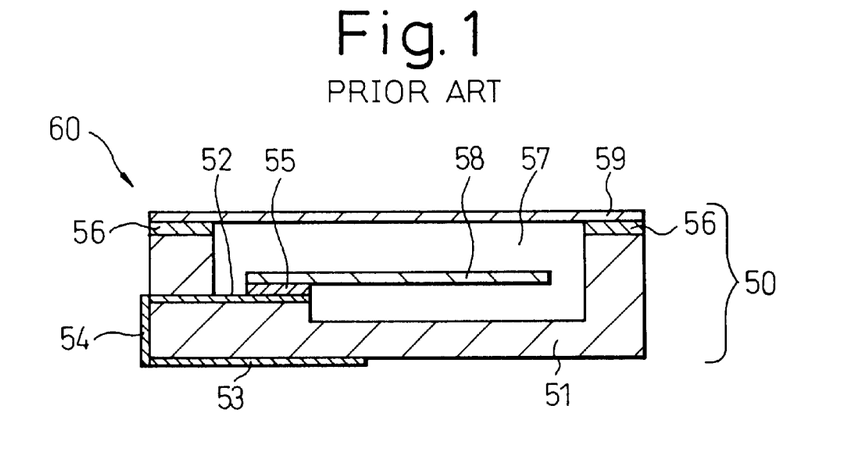
FIG. 1 is a sectional view showing an example of the constitution f the prior art crystal resonator.

For example, a crystal resonator is a quartz element-mounted package structure of surface mounting type utilizing a quartz element as a reference signal source of a clock or a mobile communication unit, and generally has a structure as shown in FIG. 1. A crystal resonator 60 comprises a quartz element 58, a package base 50 for accommodating and bonding the quartz element 58 in a closed space (cavity) 57, a junction member 55 for bonding the quartz element 58 and the package base 50, a cap 59 for contacting and closing the package base 50 to thereby form the cavity 57, and a sealing member 56 for sealing the package base 50 and the cap 59. The interior of the cavity 57 is maintained under a vacuume condition or charged with an inert gas such as nitrogen for improving the resonation characteristic (Q value) of the quartz element 58 and reducing its variation with time.

Figure 2:
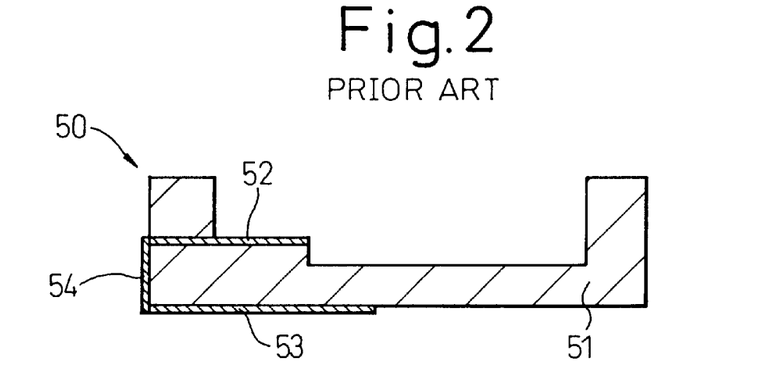
FIG. 2 is a sectional view showing a conventional package base for mounting the quartz element used in the crystal resonator of FIG. 1.

FIG. 2 is a cross-sectional view showing the package base 50 for mounting the quartz element, used with the prior art crystal resonator shown in FIG. 1. The package base 50, as shown in FIG. 2, is constituted of a base member 51 for forming a cavity along with a cap arranged in opposed relation thereto, a wiring 54 for electrically connecting the interior and the exterior of the cavity, an internal electrode 52 for fixing and electrically connecting the quartz element, and an external electrode 53 for connecting it to an external circuit. The substrate 51 is generally formed from a ceramic such as alumina. The wiring 54, the internal electrode 52 and the external electrode 53 are each formed by baking a conductive metal such as W, Mo, AgPd alloy or the like on the substrate member 51, and suitably plated with Ni or Au.

In the prior method of producing the crystal resonator, a conductive adhesive has been used widely as a junction member for bonding the quartz element and the package base. However, since a heat curing process is required for the adhesive, the adhesive develops a distortion due to its shrinkage, which in turn causes stress to be exerted on the quartz element. As a result, the Q value of the quartz element is varied, thereby causing the problem of deterioration of the stability of its characteristics.

Recently, there has been a tendency for a hard metal having little variation with time to be used as a junction member for the crystal resonator, to satisfy the requirements of long lasting stability of the characteristics along with an improved Q value of the quartz element. As explained below with reference to FIG. 3, for example, a method has been proposed to use a AuSn alloy paste as a junction member.

Figure 3:
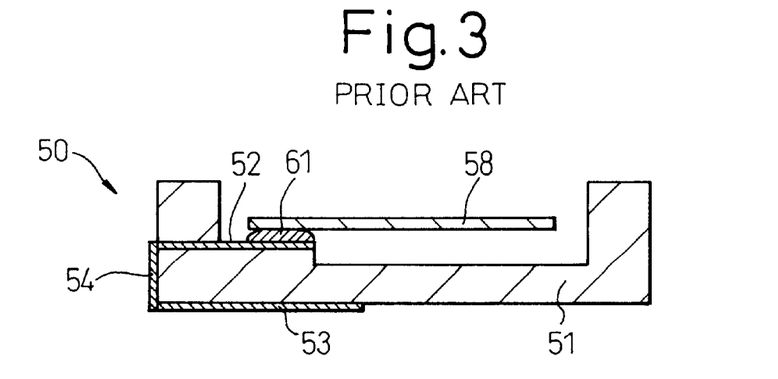
FIG. 3 is a sectional view showing a method of mounting a quartz element on the package base of FIG. 2, using an AuSn alloy paste.

In the method shown in FIG. 3, the first step is to coat a AuSn alloy paste 61 on a predetermined portion of an internal electrode 52 formed on a substrate 51 of a package base 50, and then apply the quartz element 58 thereon so that they contact. The AuSn alloy paste 61 is composed of spherical particles of the AuSn alloy containing 29 atomic % of Sn dispersed in a flux. Since the AuSn alloy paste 61 is viscose, the quartz element 58 is temporarily tacked on the internal electrode 52 of the substrate 51. Thereafter, the AuSn alloy paste 61 is melted by heating it to at least its melting point of 278° C., thereby to bond the quartz element 58 and the substrate 51. After bonding, in order to remove the flux, the assembly is washed and dried, after which it is covered with a cap (not shown) and a vacuum is applied in a vacuum tank to obtain a sealed product. However, due to the narrow gap between the quartz element and the package base (substrate) after bonding, use of the AuSn alloy in this method makes it difficult to remove the flux by washing, and undesirably leaves a residue of flux on the quartz element. The residual flux can be the cause of the above variation with time.

Further, Japanese Unexamined Patent Publication (Kokai) No. 2000-232332, for example, discloses a method of ultrasonic bonding of a quartz element with the package base by forming an Au bump on an electrode of the quartz element, as explained below with reference to FIG. 4.

Figure 4:
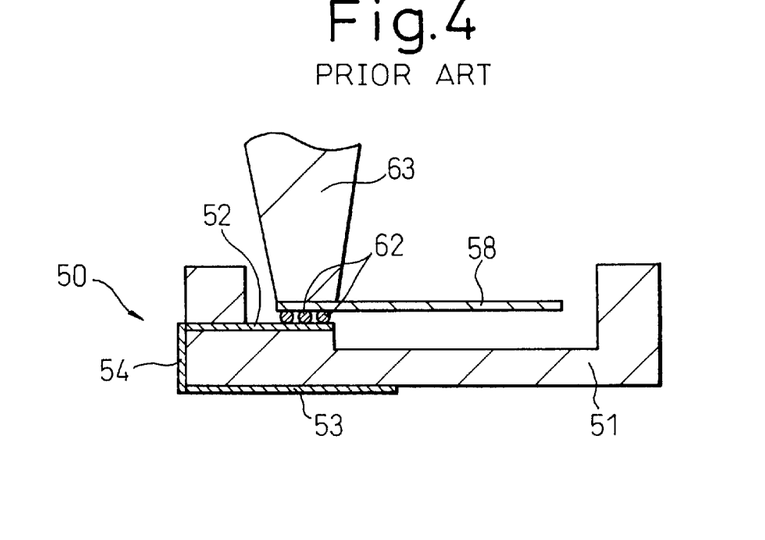
FIG. 4 is a sectional view showing a method of mounting a quartz element on the package base of FIG. 2 using Au bumps.

In the method shown in FIG. 4, the first step is to form an Au bump 62 on the electrode (not shown) of the quartz element 58, using a ball bonder. Then, the quartz element 58 is brought into contact with the package base 50 at a predetermined position (the internal electrode 52 on the substrate 51) as shown, and an ultrasonic welder 63 for applying the ultrasonic vibration from above the quartz element 58 is applied to the quartz element 58. The quartz element 58 is moved horizontally by ultrasonic waves under application of a load. The Au bump 62 and the internal electrode 52 of the package base 50 are bonded to each other by the friction generated therebetween by the ultrasonic waves. The ultrasonic junction occurs only in such a range that the Au bump 62 is in contact with the substrate 51 of the package base 50, and therefore the junction area is limited. After complete ultrasonic bonding, a cap is applied to the assembly, which is then vacuum sealed in a vacuum tank. This method, however, suffers from the problem that the junction area is so small that insufficient bonding strength results in low shock resistance. Further, when the load for ultrasonic bonding is increased in order to increase the bonding strength, a new problem of breaking or cracking in the quartz element is caused.

SUMMARY OF THE INVENTION

An object of the present invention is to solve the prior art problems caused using a conductive adhesive, an AuSn alloy paste, an Au bump or the like as a junction member for the electronic element in the production of an electronic device such as a crystal resonator, thereby providing an easy-to-produce electronic device having stable characteristics exhibiting little variation with time and high shock resistance, and a method of producing such a device.

Another object of the present invention is to provide a crystal resonator or package structure of a quartz element which can be produced easily, and which has stable characteristics with little variation with time and high shock resistance.

Still another object of the present invention is to provide a package base for mounting an electronic element that can be advantageously used for the production of the electronic device according to the invention.

These and other objects of the present invention will be easily understood from the following detailed description of the present invention.

According to one aspect of the present invention, there is provided a package base for mounting an electronic element, comprising an insulative substrate and an internal electrode formed at a predetermined position on the substrate, the internal electrode being bonded to the electronic element, in which a junction member comprising a junction layer composed of a junction alloy having a melting point higher than the mounting temperature and an anti-oxidation conductive layer covering the junction layer are provided on the internal electrode.

According to another aspect of the present invention, there is provided an electronic device comprising a housing which comprises a package base and a cap covering the surface of the package base, the housing containing at least one electronic element mounted therein, in which the package base comprises an insulative substrate and an internal electrode formed at a predetermined position on the substrate, the internal electrode being bonded to the electronic element, and the electronic element and the internal electrode are connected electrically to each other, through a junction member comprising a junction layer formed on the internal electrode and composed of a conductive junction alloy having a melting point higher than the mounting temperature and an anti-oxidation conductive layer covering the junction layer.

According to still another aspect of the invention, there is provided a method of producing an electronic device comprising a housing which comprises a package base and a cap covering the surface of the package base, the housing containing at least one electronic element mounted therein, in which the method comprises the steps of:

forming an internal electrode for bonding the electronic element at a predetermined position on the substrate of the package base;

sequentially forming, on the internal electrode, a junction layer composed of a conductive junction alloy having a melting point higher than the mounting temperature and an anti-oxidation conductive layer covering the junction layer to thereby form a junction member; and bonding and electrically connecting the electronic element and the internal electrode to each other through the junction member.

Now, the terms used in this specification will be explained. The term "electronic element" is defined in a broad sense, and includes, for example, a semiconductor element normally mounted on an electronic device, such as an IC chip, a LSI chip or a VLSI chip, a part such as a capacitor, a resistor or a conductor, and a quartz element. Thus, the term "electronic device" as used herein is defined as any of various devices employing an electronic element, such as a semiconductor device and a crystal resonator. In other words, as long as the present invention is effectively applicable, the electronic device and the electronic element mounted thereon is not specifically limited. In the practice of the present invention, the quartz element and hence the crystal resonator are especially useful.

DESCRIPTION OF THE PREFERRED EMBODIMENTS

The present invention resides in an electronic device for mounting an electronic element such as a semiconductor element or a quartz element in a housing of an insulative material, a method of producing the electronic device, and a package base for mounting the electronic element which is a component part of the electronic device. The present invention will be explained below with reference to preferred embodiments.

The electronic device according to the present invention has mounted thereon at least one electronic element in an insulative housing. The electronic element and the electronic device, as described above, includes any of various electronic elements and electronic devices, respectively.

The housing of the electronic device is constituted from an insulative package base consisting of an insulative substrate and a cap covering the surface of the package base. The substrate, to encase at least one electronic element therein, preferably has a cavity (sealed space) of a configuration and size sufficient to contain the electronic element. The cavity is generally defined by a depressed portion having a predetermined depth in a surface of the substrate and a reverse surface of the cap covered to close the depressed portion. The reverse surface of the cap may be smooth or may have a depression of a predetermined depth in an area corresponding to the depression of the substrate. In the presence of a depression in each of the surface of the substrate and the reverse surface of the cap, since an electronic element can be arranged in the central part of the cavity formed by them, the electronic element is prevented from being unduly brought into contact with the cavity-defining walls of the substrate and cap.

The housing of the electronic device will be described in more detail. The package base (substrate) according to the present invention constituting a part of the housing is preferably made of an insulative inorganic material such as ceramics, glass ceramics or glass. Preferable ceramics include but are not limited to alumina, mullite and low-temperature baking ceramics.

The ceramic substrate, for example, can be produced by forming a green sheet from a slurry containing ceramics powder and a binder as raw materials and baking the green sheet thus formed. The ceramics powder is mixed with a binder, a plasticizer and a solvent thereby to prepare a slurry, from which the green sheet is formed by the doctor blade method or the like. The thickness of the green sheet is widely varied according to the applied molding conditions. Then, the required number of green sheets are stacked to produce a laminate having a thickness corresponding to the desired ceramics substrate. The number of green sheets stacked is widely varied according to the thickness of the green sheet or the ceramics substrate.

After producing a laminate from the green sheets as described above, the baking step may be immediately carried out, followed by forming the depression for a cavity, through hole and the like. Otherwise, as in the conventional method, a yet soft laminate may be fabricated with a depression for the cavity, a through hole and the like, followed by the baking step. The laminate produced is charged into a baking furnace and can be baked by any conventional method. The baking temperature is normally about 1550 to 1650° C. If necessary, a temperature lower or higher than this temperature range may be applied.

The substrate of the package base preferably has a cavity in a surface thereof. The cavity can be formed, for example, in the surface of the ceramics substrate after being baked as described above. The method that can be used advantageously for forming the cavity, though not specifically limited, includes laser drilling or honing. The configuration and size of the cavity formed in this way are widely varied according to the details of the electronic element and the design of the electronic device.

Further, the substrate of the package base preferably has what may be called "a pillow", at a position above the upper surface of the substrate and under the electronic element, as a support member for temporarily supporting the electronic element. The presence of the support member makes it possible to bond the electronic element more easily and accurately.

An electronic element is mounted on the substrate of the package base. The electronic element, as described above, includes a semiconductor element, a quartz element, etc. Generally, only one electronic element is mounted in the package base. However, depending on the design of the electronic device, etc., two or more electronic elements may be mounted as a set or independently of each other. Also, additional elements such as parts of various types required for completing the electronic device may be mounted in the package base, especially utilizing vacant internal space in the package base. Generally, wirings, electrodes (internal electrode or external electrode) and the like may be provided inside or outside the package base.

In the package base according to the present invention, the wirings, the electrodes, etc. can be formed by any conventional method. These parts can be formed by baking a conductive metal such as Ag, W, Mo or a AgPd alloy on the substrate, and as required, it may be plated with Ni, Au or the like.

More specifically, the wirings can be formed by coating a thick layer-forming conductive paste at a predetermined pattern and baking it to make a metalized layer. A paste containing Ag as a main component such as the Ag/Pd paste can be used as the conductive paste. If necessary, a Cu paste, Au paste or the like may be used.

Generally, the wirings are formed outside the substrate of the package base. Alternatively, they may be formed through the substrate, if necessary. The wirings passing through the substrate can be formed by providing a through hole in the substrate at the same time as or in a separate step other than the step of forming a depression in the substrate, filling the through hole preferably with a thick layer-forming conductive paste, followed by the metalizing step based on baking. Both wirings can be formed simultaneously. The conductive paste used in this process includes an Ag/Pd paste or the like as in the process described above.

The cap used in combination with the package base according to the present invention to form the housing is not specifically limited and may be a tabular member or a box-like member having a depression in a flat plate. Also, the material of the cap is not specifically limited and includes, for example, Kovar™ (Fe/Ni/Co alloy), glass, glass ceramics or ceramics.

In the electronic device according to the present invention, the housing can be formed by integrating the package base and the cap by fusion. The housing is generally provided in a hermetically sealed form. The fusion between the package base and the cap can be preferably carried out through a junction layer composed of a low-temperature metal brazing material. A brazing material such as an Au/Sn alloy commonly used for brazing can be used as the low-temperature metal brazing material.

It is important for the electronic device according to the present invention to meet the following two requirements. First, the package base according to the present invention used for forming the housing comprises an internal electrode located at a predetermined position on the substrate to which electrode an electronic element is bonded, and at the same time, the electronic element and the internal electrode are electrically connected to each other through the junction member applied on the internal electrode. Second, the junction member is a composite structure formed of a junction layer composed of a conductive junction alloy having a high melting point and an anti-oxidation conductive layer applied over on the junction layer.

The junction layer as a main part of the junction member, as described above, is composed of a conductive junction alloy having a high melting point so as not to melt at the high temperatures (mounting temperatures) used in the step of mounting the electronic device on a circuit board or the like. The junction alloy having a high melting point preferably contains Au as a main component. A suitable Au alloy includes but is not limited to an AuSn alloy, an AuGe alloy, an AuSi alloy, an AuGa alloy and others. These Au alloys may be used alone or in a combination of two or more. Also, the junction layer formed of these conductive junction alloys can normally exhibit a sufficient performance, when used as a single layer, however, if required, they may be formed as two or more layers. The junction layer can be formed by using any conventional method, including baking, plating, vapor deposition and sputtering.

The junction member also comprises an anti-oxidation conductive layer covering the junction layer described above. The conductive layer can be formed of a conductive metal such as Au, Pd or Pt or an alloy thereof. In particular, a layer of Au or an alloy thereof is especially effective. The conductive layer can be formed by any conventional method, including baking, plating, vapor deposition or sputtering.

The package base for mounting an electronic element and the electronic device according to the present invention can be advantageously produced by different methods.

The electronic device, for example, can be advantageously produced using the steps of:

forming an internal electrode for bonding an electronic element, at a predetermined position on the substrate of a package base;

producing a junction member by sequentially forming, on the internal electrode, a junction layer composed of a conductive junction alloy having a melting point higher than the mounting temperature and an anti-oxidation conductive layer covering the junction layer; and bonding and electrically connecting the electronic element and the internal electrode to each other through the junction member.

Further, in this advantageous method of producing the electronic device, the step of bonding the electronic element and the internal electrode through the junction member is preferably carried out by temporarily tacking, by ultrasonic bonding, the electronic element to the junction member formed on the internal electrode, and then heating the temporarily assembled product to thereby melt the conductive metal of the junction member. As a result, the electronic element and the internal electrode are bonded to each other.

In this bonding step, a bonding jig having a protrusion can be advantageously applied over the package base so that the protrusion can contact the electronic element. This is because the electronic element can be held at a desirable position during the bonding step by the way of the protrusion.

The surface of the junction alloy of the junction member, if left bare, would be oxidated, and thus ultrasonic bonding could not easily be carried out. In contrast, in the method of producing the electronic device according to the present invention, the electronic element can be easily and temporarily tacked using the ultrasonic bonding because of the presence of an anti-oxidation layer of Au or the like. Further, the method of the present invention does not make use of flux unlike the conventional method, and therefore the need to conduct flux washing after bonding is eliminated, thereby facilitating the production process. Furthermore, since no flux residue is created, variation in the characteristics with time is reduced. Furthermore, bonding by melting the junction alloy increases the junction area and therefore the bonding strength, thereby resulting in improved shock resistance. In addition, temporary tacking by ultrasonic bonding ensures uniform heat transmission, thereby resulting in a junction with high releability and improved bonding strength.

EXAMPLES

Now, some examples of the present invention will be described. In the examples described below, the present invention is described with reference to the production of a crystal resonator. However, it should be noted that the present invention is not restricted to these examples.

Figure 5:
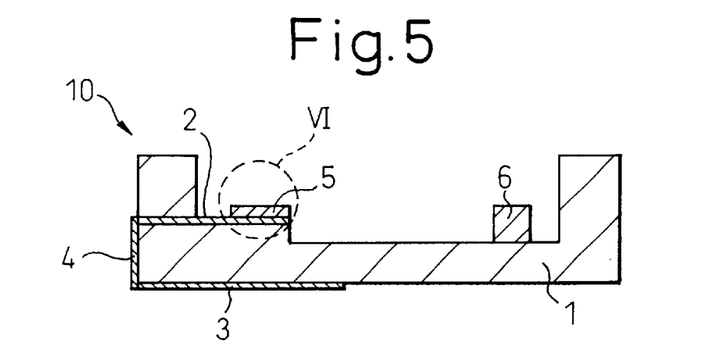
FIG. 5 is a sectional view showing a preferred example of the package base according to the present invention.

FIG. 5 is a sectional view showing a package base 10 for mounting a quartz element according to a preferred embodiment of the invention. The package base 10, as shown, is constituted by a substrate 1 for producing a cavity (hermetically sealed space) by being covered with a cap, a wiring 4 for electrically connecting the inside and the outside of the cavity, an internal electrode 2 for bonding and supporting the quartz element (not shown), a junction member 5, an external electrode 3 used for connection with an external circuit, and a support member (pillow) 6 used for the purpose of supporting the quartz element at the time of bonding it to the internal electrode.

The substrate 1 is selected from materials simultaneously having insulability, hermeticity and heat resistance, and suitable materials of the substrate 1 include ceramics such as alumina, glass ceramics and glass. The wiring 4, the internal electrode 2 and the external electrode 3 are each formed by baking W, Mo, a AgPd alloy or the like on the substrate 1. They may be appropriately plated with Ni, Au or the like.

Figure 6:
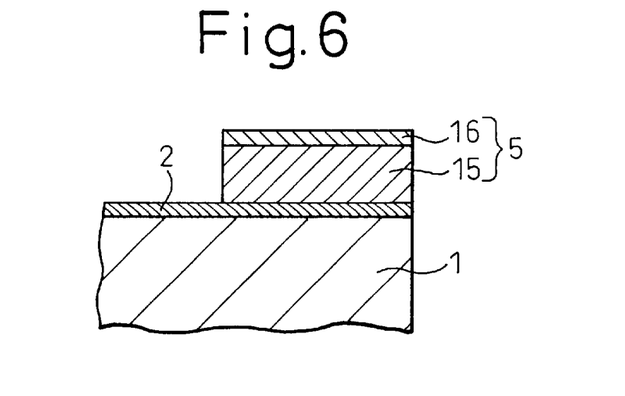
FIG. 6 is an enlarged sectional view of the section VI of the package base of FIG. 5.

The junction member 5, as understood from the enlarged sectional view of FIG. 6 showing the section VI of FIG. 5, includes a junction layer 15 composed of a junction alloy and a conductive layer 16 covering the junction layer 15, which are sequentially formed on the internal electrode 2. The junction layer 15, which is generally used as a single layer, may be used in two or more layers, if required. The conductive layer 16, which is formed only on the upper surface of the junction layer 15 in this drawing, may be formed to cover the upper and side surfaces of the junction layer 15, if required. The junction layer 15 and the conductive layer 16 can be formed by any conventional method, such as baking, plating, vapor deposition or sputtering.

In the case of the junction member 5, it is important to select the junction alloy used for forming the junction layer 15. The junction alloy is selected based on the following conditions. The crystal resonator having a quartz element mounted thereon is generally mounted by using a solder on a circuit board, and a creamy solder is frequently used in a reflow furnace. In the reflow furnace, the creamy solder is melted normally by heating it to 220 to 240° C. In recent years, a solder free of lead has been used for environmental protection, and in such a case, due to its high melting point, the solder is heated to about 260° C. Thus, the junction alloy is required to have a sufficiently higher melting point than the reflow temperature, i.e., mounting temperature, for mounting the device on the circuit board. An excessively high reflow temperature, on the other hand, would damage the wirings of the quartz element, and therefore the temperature applied during production of the device is required to be maintained at as low a level as possible. Accordingly, a junction alloy such as AuSn alloy containing 29 at. % Sn and having a melting point of 278° C., AuGe alloy containing 28 at. % Ge and having a melting point of 361° C., AuSi alloy containing 18.6 at. % Si and having a melting point of 363° C., AuGa alloy containing 30 at. % Ga and having a melting point of 341° C., and other alloys can be advantageously used.

The junction alloys, if used as produced, would develop an oxide layer on the surface thereof. Further, a material having high malleability is desirable for ultrasonic bonding. For these reasons, the surface of the junction layer consisting of the junction alloy is preferably coated with an anti-oxidation conductive metal layer. The conductive layer can be formed using any of various metal materials, of which Au or an alloy thereof is especially advantageously used.

Further, in order to improve the adhesion between the junction layer and the conductive layer, an intermediate layer such as Ni, Cr, Ti or the like is preferably inserted between them. In the case where the surface of the conductive layer is coated with Au, however, such an intermediate layer is not required.

Using the package base for mounting the quartz element explained with reference to FIGS. 5 and 6, the crystal resonator can be produced in the following manner, for example.

Figure 7:
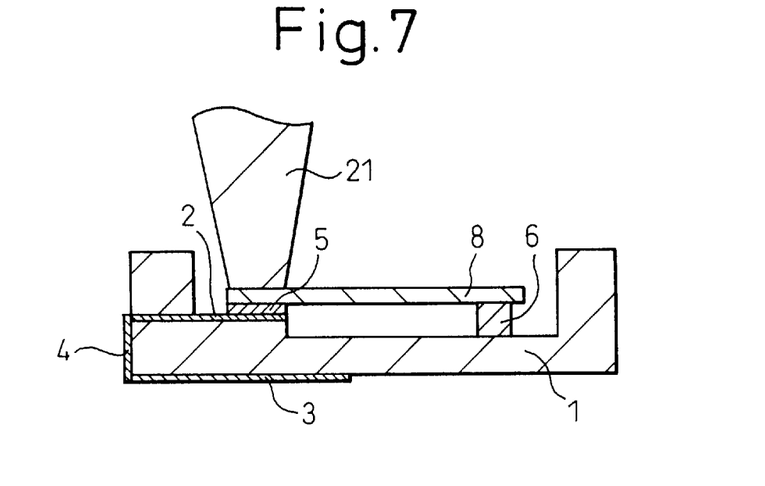
FIG. 7 is a sectional view showing a method of ultrasonic bonding of a quartz element using the package base of FIG. 5.

As shown in FIG. 7, after the substrate 1 of the package base is fixed on a base (not shown) by vacuum suction or other means, the quartz element 8 is placed on the substrate 1. In this step, the junction member 5 and the support member (pillow) 6 are utilized to support the quartz element 8. Though not shown, the quartz element 8 is provided with an electrode composed of a Ni-based or Cr-based Au layer at the site where the quartz element 8 is in contact with the junction member 5.

The quartz element 8, after being placed on the substrate 1 of the package base, is temporarily tacked thereon. With an ultrasonic welder 21 located just above the junction member 5, ultrasonic waves are applied to the quartz element 8 under a load. The conditions for ultrasonic bonding include a load of 400 to 600 g/number of the quartz element and a temperature of 230° C. The ultrasonic waves move the quartz element 8 in the horizontal direction, the friction between Au of the electrode of the quartz element 8 and Au of the conductive layer of the junction member 5 integrates them, thereby temporarily tacking the quartz element 8 as the result of ultrasonic bonding.

Figure 8:
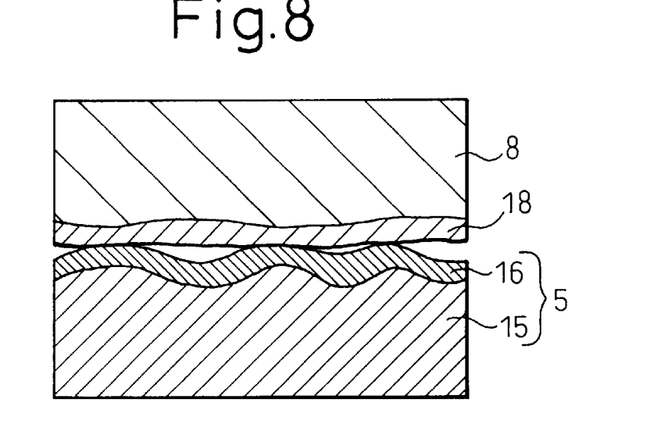
FIG. 8 is a an enlarged sectional view showing the state of the resulting junction after the ultrasonic bonding of the quartz element.

The manner in which the quartz element 8 is temporarily tacked is shown in FIG. 8. That is, from the microscopic viewpoint, the conductive layer 16 of the junction member 5 and the electrode 18 of the quartz element 8 are bonded to each other only partially, so that the bonding strength between the junction member and the quartz element 8 is low.

Then, the package base having the temporarily tacked quartz element is charged into a vacuum tank, and after vacuuming, heated to higher than the melting point of the junction alloy constituting the junction member, thereby to melt the junction alloy for bonding. In this step, since the quartz element and the package base are temporarily tacked to each other, heat conduction is carried out efficiently, with the result that the temperature of the junction is uniform, thereby increasing the bonding strength. On the other hand, if the temporary tacking process described above is omitted, because there would be a temperature difference between the electrode of the quartz element and the junction alloy due to application of the vacuum, the electrode and the junction alloy cannot be completely bonded, or, if bonded, only partial bonding can be obtained.

Figure 9:
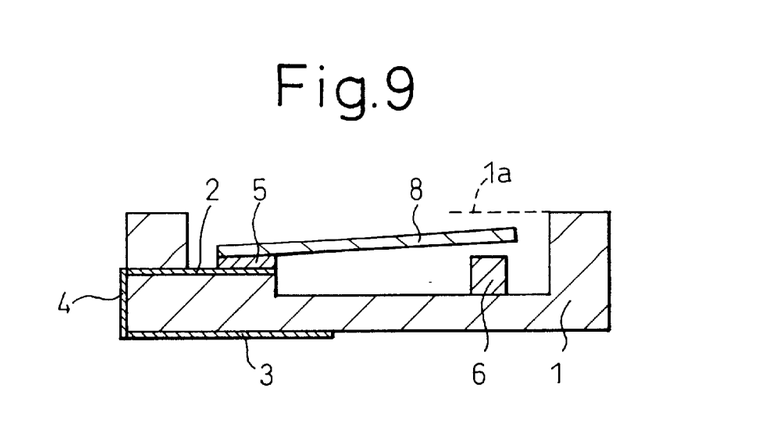
FIG. 9 is a sectional view showing a method of controlling the position at which a quartz element is arranged, according to the present invention.
Figure 10:
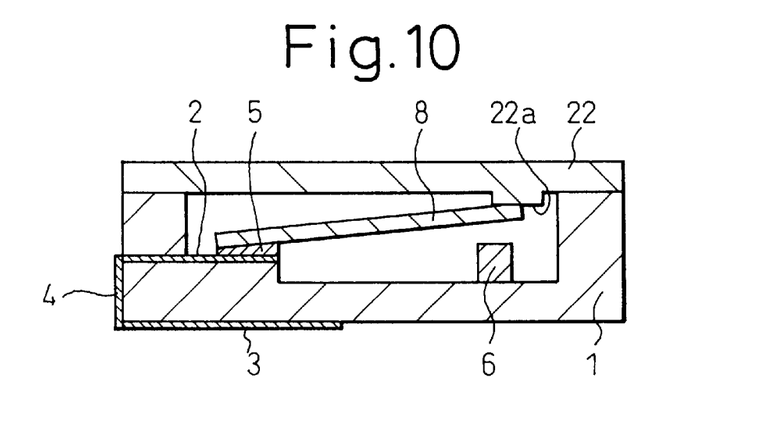
FIG. 10 is a sectional view showing another method of controlling the position at which a quartz element is arranged, according to the present invention.

The quartz element, when heated for bonding, is pulled away from the support member (pillow) by the surface tension of the junction alloy in molten state. In this step, as long as the heating temperature is controlled properly, as shown in FIG. 9, the quartz element 8 can be caused to detach from the support member 6 and fixed at a position lower than the upper surface 1a of the substrate 1 of the package base. In the case where a plurality of package bases are processed at once time, however, variation in the heating temperature at different sites may cause projection of an end of the quartz element upward from an upper surface of the package case. In such a case, as shown in FIG. 10, it is recommended that the heating process be carried out in the presence of a bonding jig 22 having a protrusion 22a for covering the package base. After covering of the package base by the bonding jig 22, heating is carried out under such conditions. Thus, the quartz element 8 stops as a result of coming into contact with the protrusion 22a of the bonding jig 22 when it moves upwards, and therefore the quartz element 8 does not project above the upper surface of the package base. The position and the shape of the protrusion 22a of the bonding jig 22 can be optionally changed, depending upon the location and the shape of the quartz element 8.

Figure 11:
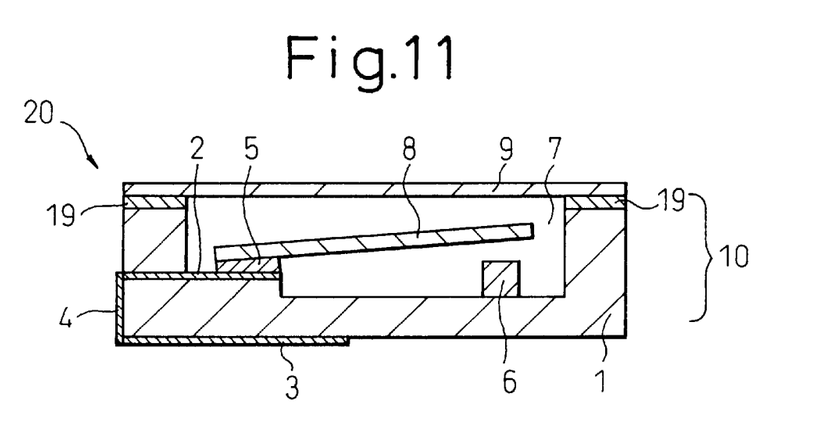
FIG. 11 is a sectional view showing an example of the structure of the crystal resonator according to the present invention.

Upon complete bonding of the quartz element, as shown in FIG. 11, a Kovar™ cap 9 is used to cover the upper surface of the package base 10, and a vacuum sealing process is carried out in a vacuum tank. To attain vacuum sealing, the package base 10 and the cap 9 are integrated with each other by fusion welding, for example, through a junction layer 19 composed of a low-temperature metal brazing material. An Au/Sn alloy or the like can be used as the low-temperature metal brazing material. As a result of vacuum sealing, the crystal resonator 20 as shown is produced.

Figure 12:
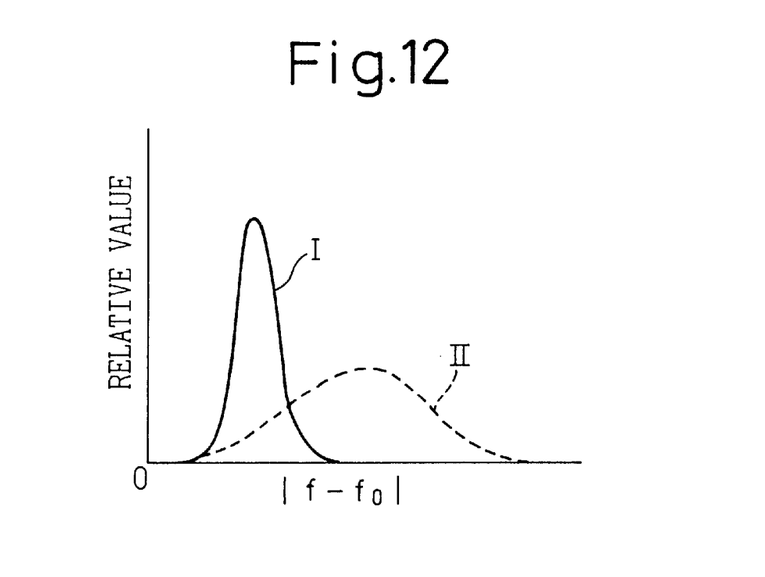
FIG. 12 is a graph comparing the distribution of the resonance frequency of the crystal resonator according to the present invention with that of the prior art crystal resonator.

FIG. 12 is a graph showing the distribution of the absolute value of the difference $|f-f_0|$ between the resonance frequency f and the initial resonance frequency $f_0$ of the crystal resonator having a package structure upon the lapse of a predetermined time following the production thereof. Comparison between the curves in this graph shows that the crystal resonator (curve I) produced using the package base according to the present invention exhibits less variation with time and thus is more stable than the prior art crystal resonator (using the conductive adhesive "TB3303 Series" of Three Bond for bonding the quartz element to the package base; curve II).

Figure 13:
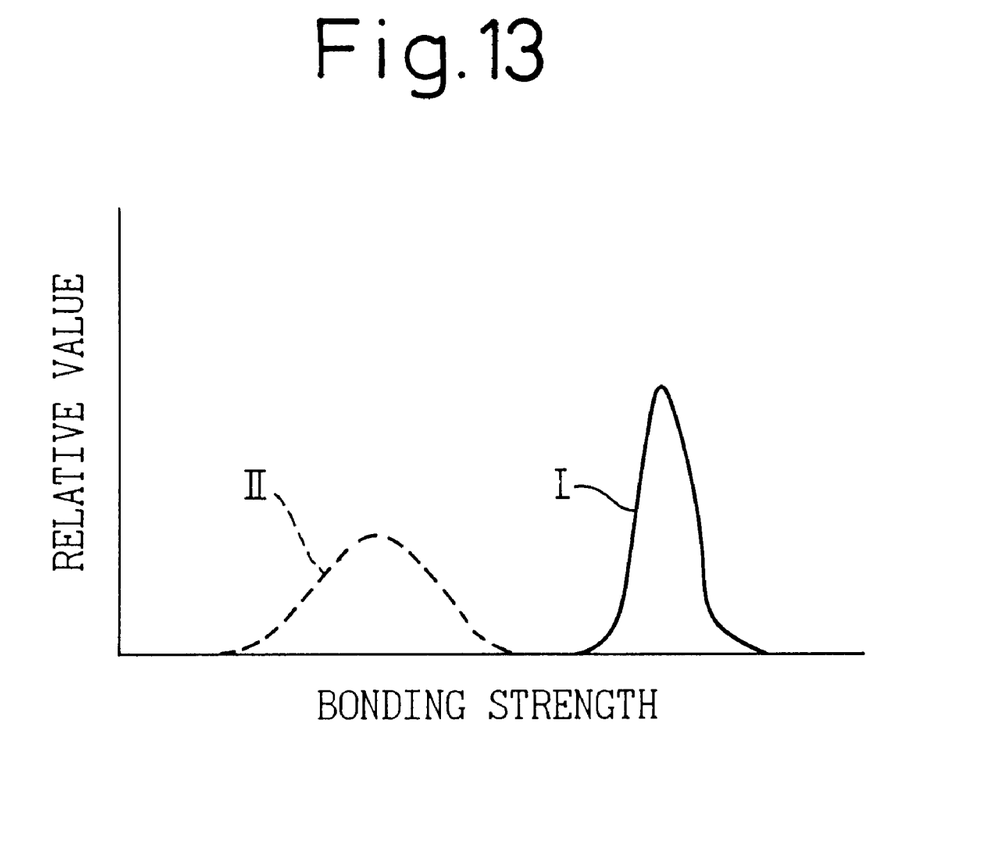
FIG. 13 is a graph comparing the distribution of the bonding strength of the crystal resonator according to the present invention with that of the prior art crystal resonator.

FIG. 13 shows the distribution (curve I) of the bonding strength of the quartz element in the crystal resonator produced using the package base according to the present invention. Comparison of the curve I with the curve obtained by the prior art (using the conductive adhesive "TB3303 Series" of Three Bond for bonding the quartz element to the package base; curve II) shows that the quartz element in the crystal resonator according to the present invention has much higher bonding strength along with lower variation in the bonding strength, than the prior art crystal resonator.

It will thus be understood from the foregoing description that use of a package base for mounting a quartz element according to the present invention makes it possible to temporarily tack the quartz element easily by ultrasonic bonding, and the absence of flux eliminates the need for flux washing after bonding, thereby facilitating production. Also, the crystal resonator produced using the package base according to the present invention exhibits less variation with time because of the absence of flux residue. Further, according to the present invention, the bonding strength of the quartz element is increased, and there is lower variation in the bonding strength.

What is claimed is:

1. A package base for mounting an electronic element thereon, said package base comprising an insulative substrate, and an internal electrode formed at a predetermined position for receiving and electrically bonding an electronic element on said substrate, in which a junction member comprising a junction layer composed of a conductive junction alloy having a melting point higher than a temperature to be applied when said package base is mounted on a mounting board after bonding of said electronic element on said substrate and an anti-oxidation conductive layer covering said junction layer is provided on said internal electrode.

2. A package base as defined in claim 1, in which the junction alloy of said junction layer is an Au alloy.

3. A package base as defined in claim 2, in which said Au alloy is at least one Au alloy selected from the group consisting of an AuSn alloy, an AuGe alloy, an AuSi alloy and an AuGa alloy.

4. A package base as defined in claim 1 or 2, in which the anti-oxidation conductive layer of said junction member is a layer composed of a conductive metal or an alloy thereof, said conductive metal being selected from the group consisting of Au, Pd and Pt.

5. A package base as defined in claim 1 or 2, in which said substrate comprises ceramics, glass ceramics or glass.

6. A package base as defined in claim 1 or 2, in which said substrate further comprises a support member for temporarily supporting said electronic element at a position above an upper surface of said substrate and under said electronic element.

7. A package base as defined in claim 1 or 2, in which said electronic element is a quartz element.

8. An electronic device comprising a housing which comprises a package base and a cap covering the surface of said package base, at least one electronic element being included in an interior of said housing and mounted on the package base of said housing, in which said package base comprises an insulative substrate and an internal electrode formed at a predetermined position for receiving and electrically bonding said electronic element on said substrate, and said electronic element and said internal electrode are electrically connected to each other through a junction member comprising a junction layer composed of a conductive junction alloy having a melting point higher than a temperature to be applied when said package base is mounted on a mounting board after bonding of said electronic elements on said substrate and an antioxidation conductive layer covering said junction layer.

9. An electronic device as defined in claim 8, in which the junction alloy of said junction layer is an Au alloy.

10. An electronic device as defined in claim 9, in which said Au alloy is at least one Au alloy selected from the group consisting of an AuSn alloy, an AuGe alloy, an AuSi alloy and an AuGa alloy.

11. An electronic device as defined in claim 8 or 9, in which the anti-oxidation conductive layer of said junction member is a layer composed of a conductive metal or an alloy thereof, said conductive metal being selected from the group consisting of Au, Pd and Pt.

12. An electronic device as defined in claim 8 or 9, in which said substrate comprises ceramics, glass ceramics or glass.

13. An electronic device as defined in claim 8 or 9, in which said substrate further comprises a support member for temporarily supporting said electronic element at a position above an upper surface of said substrate and under said electronic element.

14. An electronic device as defined in claim 8 or 9, in which said device is a crystal resonator wherein said electronic element is a quartz element.

15. A method of producing an electronic device comprising a housing which comprises a package base and a cap covering the surface of said package base, at least one electronic element being included in an interior of said housing and mounted on the package base of said housing, in which said method comprises the steps of:

forming an internal electrode for bonding said electronic element at a predetermined position on a substrate of said package base;

sequentially forming, on said internal electrode, a junction layer composed of a conductive junction alloy having a melting point higher than a temperature to be applied when said package base is mounted on a mounting board after bonding of said electronic element on said substrate and an anti-oxidation conductive layer covering said junction layer to thereby form a junction member; and bonding and electrically connecting said electronic element and said internal electrode to each other through said junction member.

16. A method of producing an electronic device as defined in claim 15, in which said step of bonding said electronic element and said internal electrode to each other through said junction member comprises the steps of temporarily bonding said electronic element by ultrasonic bonding to the junction member formed on said internal electrode, and after said temporary bonding, heating the assembly so that a conductive metal of said junction member is melted thereby to bond said electronic element and said internal electrode to each other.

17. A method of producing an electronic device as defined in claim 16, in which said bonding step comprises the step of heating the assembly while covering it with a bonding jig having a protrusion, in such a manner that upward movement of said package base is stopped by said bonding jig.

18. A method of producing an electronic device as defined in claim 15 or 16, in which an Au alloy is used as the conductive junction alloy of said junction layer.

19. A method of producing an electronic device as defined in claim 15 or 16, in which the conductive layer of said junction member is formed from a anti-oxidation conductive metal selected from the group consisting of Au, Pd and Pt or an alloy thereof.

20. A method of producing an electronic device as defined in claim 15 or 16, in which said electronic device is a crystal resonator employing a quartz element as said electronic element.

* * * * *